United States Patent
Kung

(10) Patent No.: US 8,261,436 B2
(45) Date of Patent: Sep. 11, 2012

(54) FABRICATING PROCESS OF CIRCUIT SUBSTRATE

(75) Inventor: Chen-Yueh Kung, Taipei Hsien (TW)

(73) Assignee: VIA Technologies, Inc., New Taipei (TW)

( * ) Notice: Subject to any disclaimer, the term of this patent is extended or adjusted under 35 U.S.C. 154(b) by 385 days.

(21) Appl. No.: 12/646,384

(22) Filed: Dec. 23, 2009

(65) Prior Publication Data

US 2011/0108313 A1    May 12, 2011

(30) Foreign Application Priority Data

Nov. 6, 2009  (TW) ................. 98137833 A

(51) Int. Cl.
*H01R 9/00* (2006.01)
*H05K 3/00* (2006.01)

(52) U.S. Cl. ............ 29/842; 29/825; 29/831; 29/846
(58) Field of Classification Search .......... 29/842, 29/825, 830, 831, 846, 847; 174/254, 255, 174/260–264

See application file for complete search history.

(56) References Cited

U.S. PATENT DOCUMENTS

| 6,326,561 | B1* | 12/2001 | Watanabe et al. | 174/264 |
| 6,583,364 | B1* | 6/2003 | Kurita et al. | 174/254 |
| 6,977,348 | B2* | 12/2005 | Ho et al. | 174/255 |
| 2011/0103815 | A1 | 5/2011 | Kung et al. | |
| 2012/0018207 | A1 | 1/2012 | Kung | |

FOREIGN PATENT DOCUMENTS

| CN | 2755906 | 2/2006 |
| CN | 1980531 A | 6/2007 |
| CN | 101534609 | 9/2009 |

* cited by examiner

*Primary Examiner* — Thiem Phan
(74) *Attorney, Agent, or Firm* — J.C. Patents

(57) ABSTRACT

A circuit substrate fabricating process includes a base layer, a patterned conductive layer, a dielectric layer, an outer pad and a conductive block. The patterned conductive layer is disposed on the base layer and has an inner pad. The dielectric layer is disposed on the base layer and covers the patterned conductive layer. The outer pad is disposed on the dielectric layer. The conductive layer is passed through the dielectric layer and connected between the outer pad and the inner pad, wherein the outer pad and the conductive block are formed as an integrative unit, and an outer diameter of the outer pad is substantially equal to an outer diameter of the conductive block. In addition, a fabricating process for the circuit substrate is also provided.

11 Claims, 14 Drawing Sheets

FABRICATING PROCESS OF CIRCUIT SUBSTRATE

CROSS-REFERENCE TO RELATED APPLICATION

This application claims the priority benefit of Taiwan application serial no. 98137833, filed on Nov. 6, 2009. The entirety of the above-mentioned patent application is hereby incorporated by reference herein and made a part of this specification.

BACKGROUND OF THE INVENTION

1. Field of the Invention

The invention relates to a circuit substrate and a fabricating process thereof, and more particularly to a circuit substrate with an integrally formed pad and conductive block and a fabricating process thereof.

2. Description of Related Art

In current semiconductor package technology, a circuit substrate is one of the most frequently used packaging components. The circuit substrate is mainly constituted by alternately stacked multiple layers of patterned conductive layer and multiple layers of dielectric layer. Two circuit layers are electrically connected to each other through a conductive via. With the increase of circuit density in the circuit substrate, an important task is to dispose the circuit efficiently with a limited space.

SUMMARY OF THE INVENTION

The invention is directed to a fabricating process of a circuit substrate. Firstly, a base layer, a patterned conductive layer, and a dielectric layer are provided. The patterned conductive layer is disposed on the base layer and has an inner pad. The dielectric layer is disposed on the base layer and covers the patterned conductive layer. Next, a patterned metal mask is formed on the dielectric layer. The patterned metal mask has a first opening exposing a portion of the dielectric layer. The portion of the dielectric layer exposed by the first opening is removed to form a dielectric opening. The dielectric opening exposes the inner pad. A first patterned mask is formed on the patterned metal mask. The first patterned mask has a second opening exposing the inner pad. A conductive structure is formed to cover the inner pad. The conductive structure includes a conductive block, an outer pad, and a first metal layer. The conductive block fills the dielectric opening, the outer pad fills the first opening, and the first metal layer fills the second opening The first patterned mask, the first metal layer, and the patterned metal mask are removed.

The invention is directed to a circuit substrate including a base layer, a patterned conductive layer, a dielectric layer, an outer pad, and a conductive block. The patterned conductive layer is disposed on the base layer and has an inner pad. The dielectric layer is disposed on the base layer and covers the patterned conductive layer. The outer pad is disposed on the dielectric layer. The conductive block penetrates the dielectric layer and is connected between the outer pad and the inner pad. The outer pad and the conductive block are formed as an integrative unit.

In order to make the aforementioned and other features and advantages of the invention more comprehensible, embodiments accompanying figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
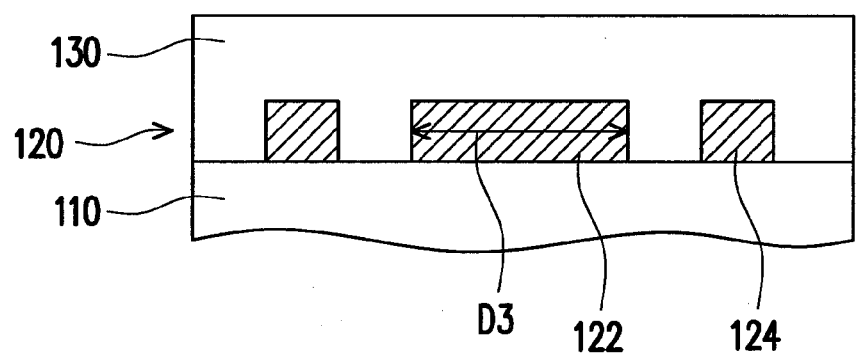
FIGS. 1A through 1N illustrate a cross-sectional flowchart showing a fabricating process of a circuit substrate according to one embodiment of the invention.
Figure 1B:
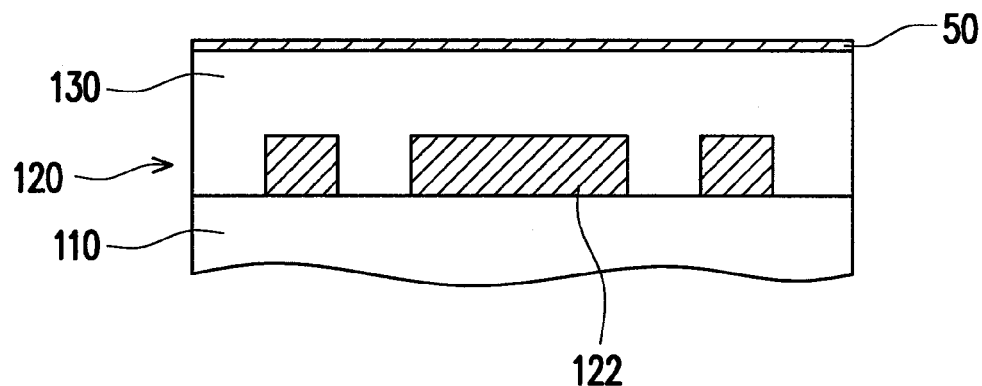
FIG. 1O is a three-dimensional diagram of an inner pad and a conductive block in FIG. 1A.
Figure 1C:
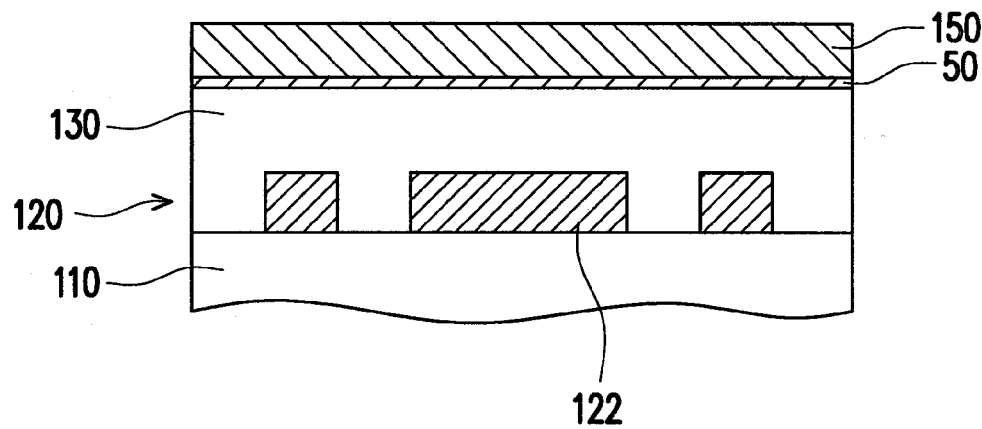
Figure 1D:
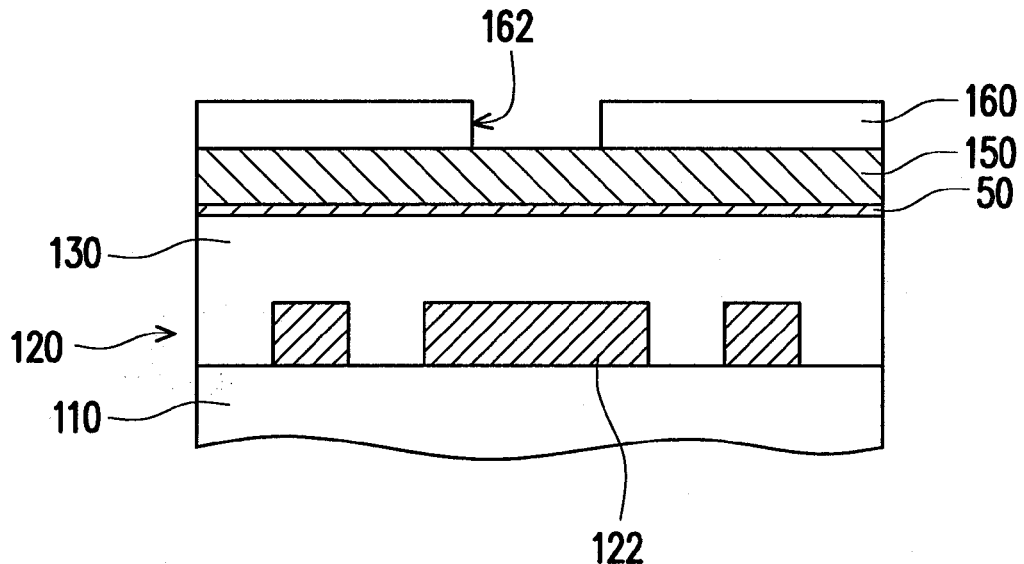
Figure 1E:
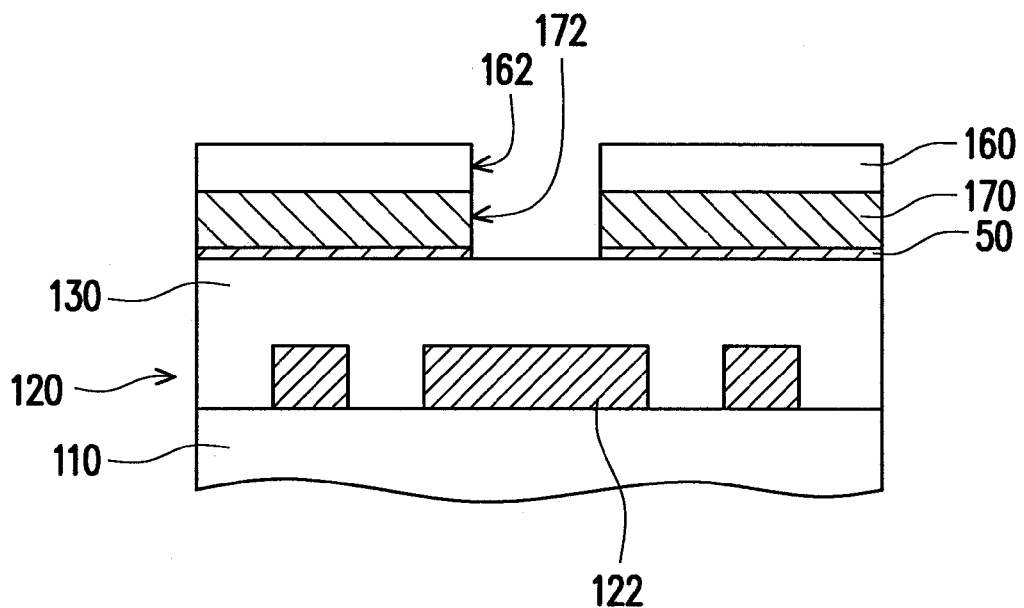
Figure 1F:
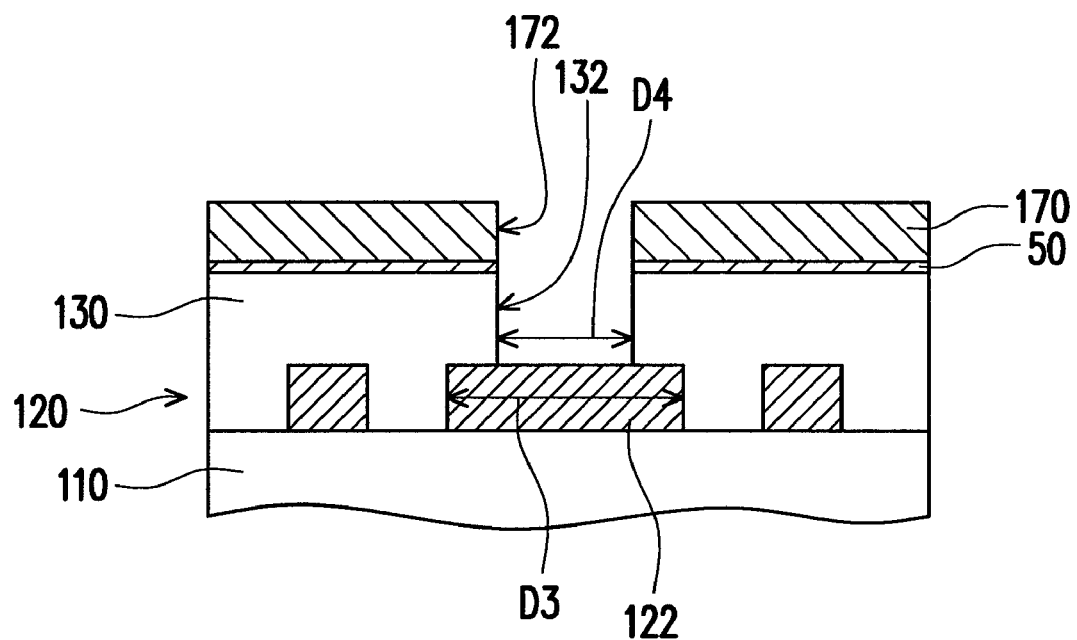
Figure 1G:
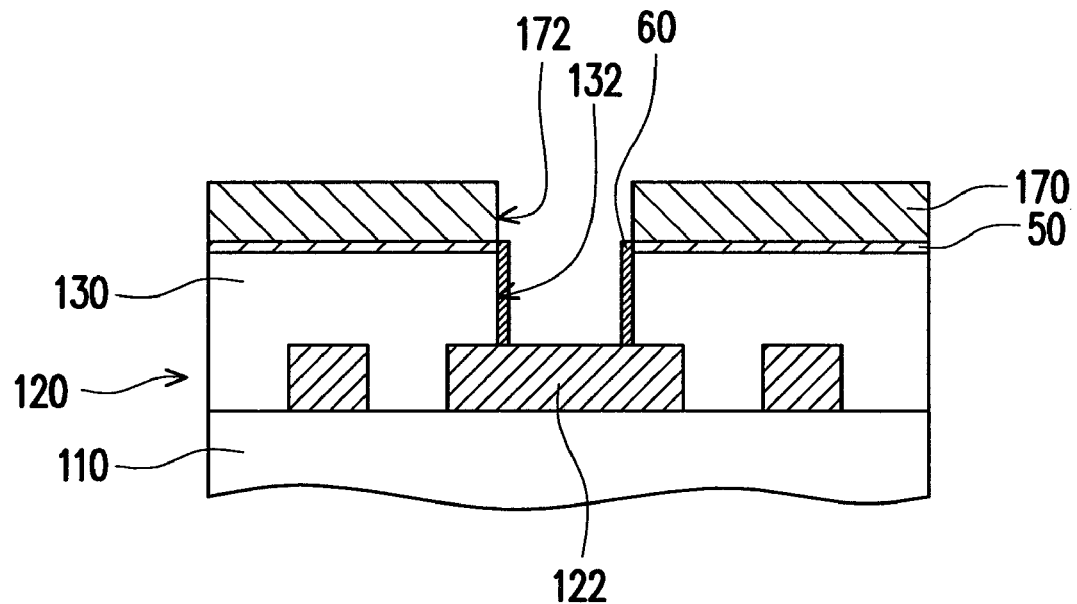
Figure 1H:
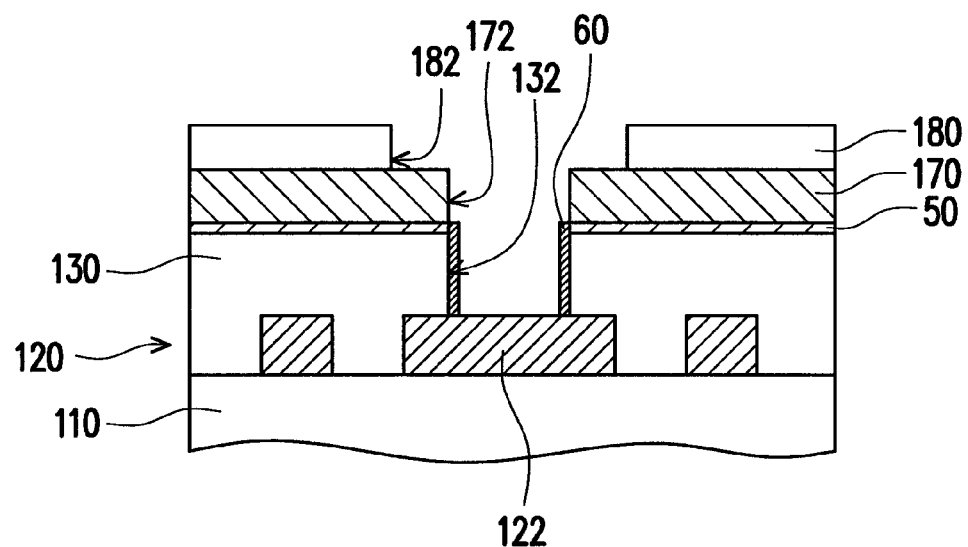
Figure 1I:
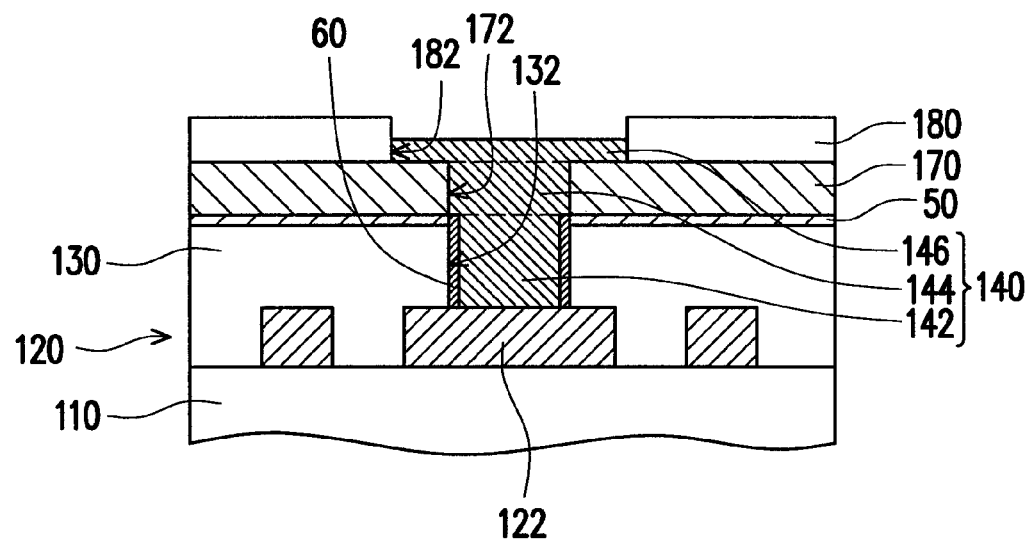
Figure 1J:
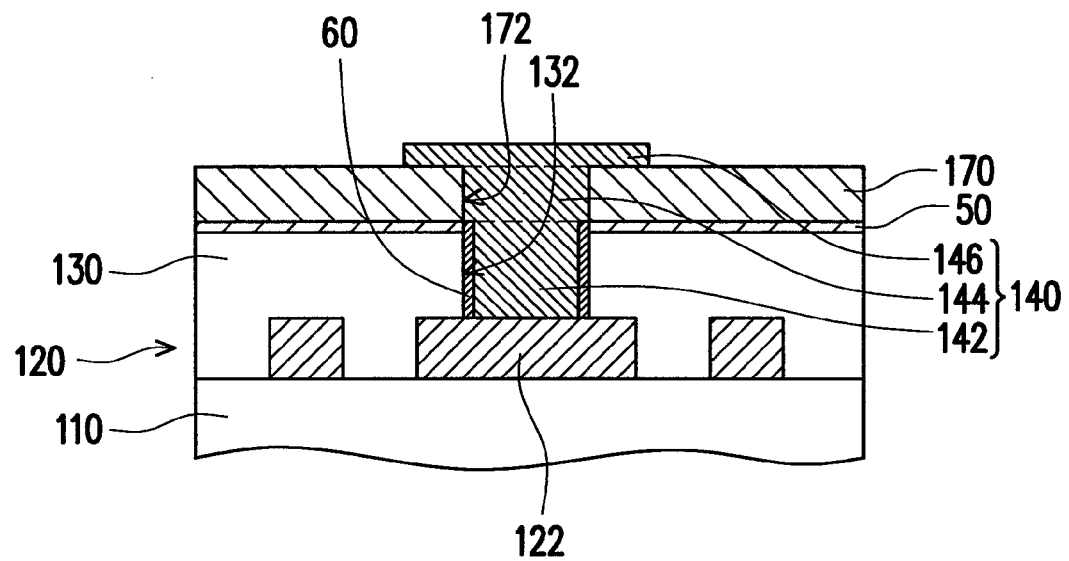
Figure 1K:
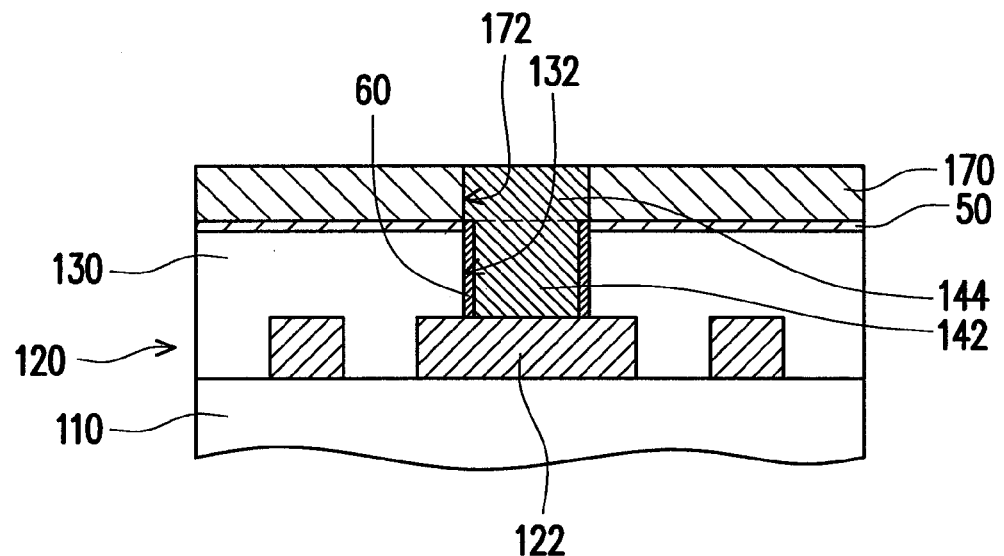
Figure 1L:
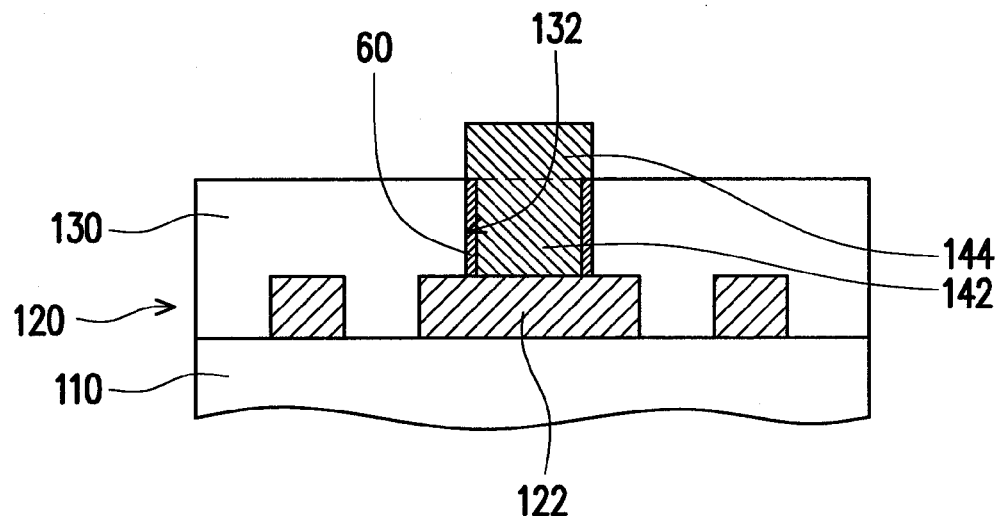
Figure 1M:
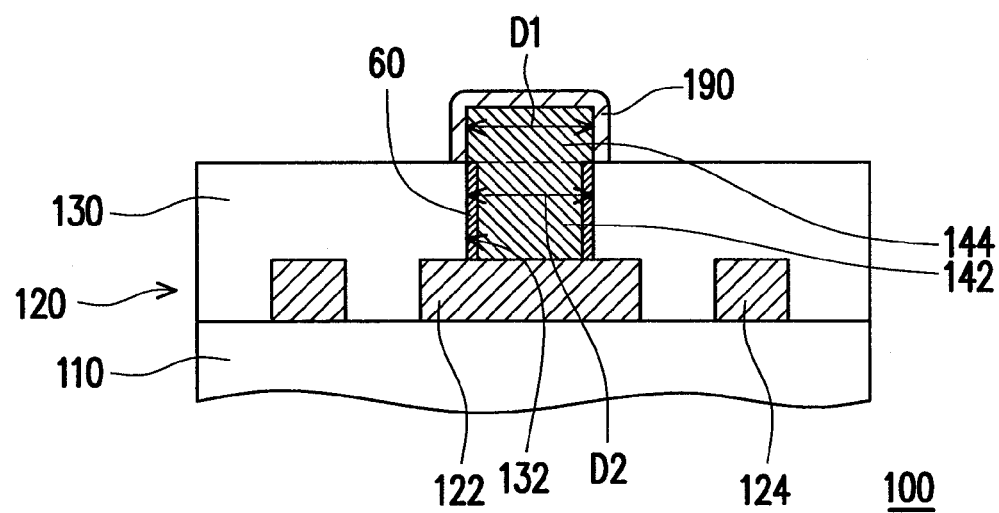
Figure 1N:
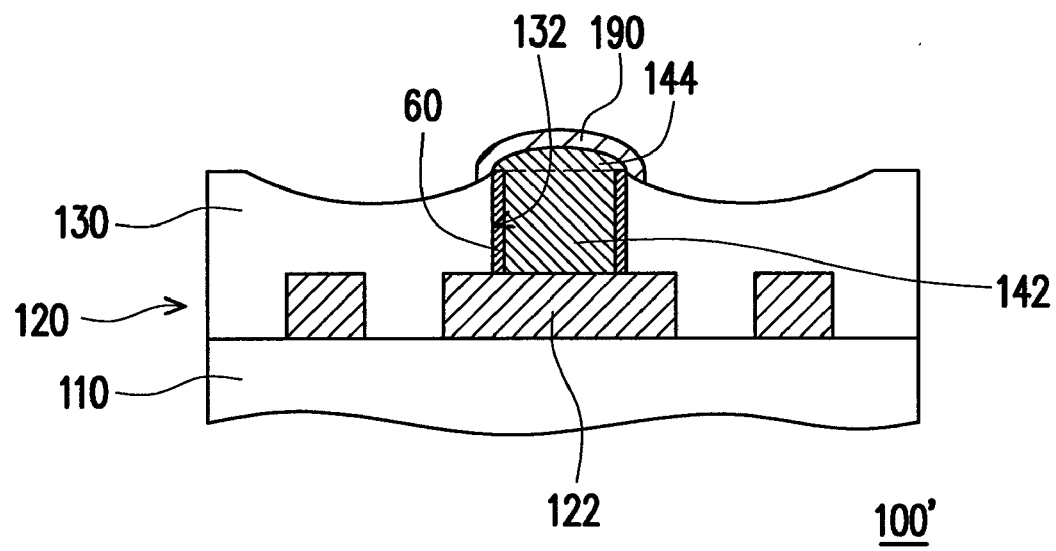
Figure 1O:
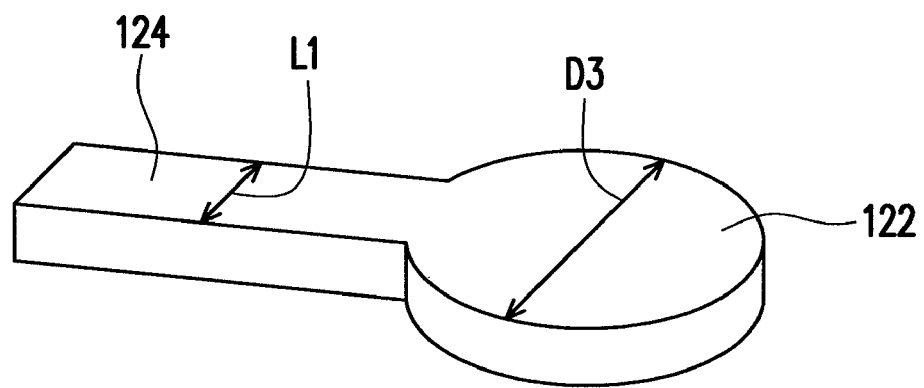

FIGS. 1A through 1N illustrate a cross-sectional flowchart showing a fabricating process of a circuit substrate according to one embodiment of the invention. First of all, referring to FIG. 1A, a base layer 110, a patterned conductive layer 120, and a dielectric layer 130 are provided. The base layer 110 may be one of circuit layers of a chip, one of circuit layers of a chip carrier, or one of circuit layers of a printed circuit board. Furthermore, one or more layers may be deposited under the base layer to be as other circuit layer(s). The circuit layer(s) and the base layer may electrically connect together by plug; even electrically connect with a component(s) respectively. The component(s) may be an active component or an inactive component. The patterned conductive layer 120 is disposed on the base layer 110 and has an inner pad 122. As shown in FIG. 1O, the inner pad 122 is a terminal structure extended from an inner conductive line 124 and the inner pad 122 is connected thereto. An outer diameter D3 of the inner pad 122 is larger than a line width L1 of the inner conductive line 124. Moreover, as depicted in the cross-section of FIG. 1A, a portion of the patterned conductive layer 120 is adopted as the inner conductive line 124, such as a signal line, a grounded line, a power line, and so on. The dielectric layer 130 is disposed on the base layer 110 and covers the patterned conductive layer 120. In another embodiment, the dielectric layer 130 can be substituted with a solder mask material layer (not shown).

Afterwards, referring to FIG. 1B and FIG. 1C, a seed layer 50 for electroplating is formed on the dielectric layer 130 and a metal layer 150 is electroplated on the seed layer 50. The metal layer 150 is made of, for instance, Ni, Sn, Sn/Pb, Mg, Zn, Co, Fe, Ti, W, or other non-seed layer metals. In the present embodiment, the metal layer 150 is a mask layer or a barrier layer. Referring to FIG. 1D, a patterned mask 160 is formed on the metal layer 150. The patterned mask 160 has an opening 162 exposing a portion of the metal layer 150. The patterned mask 160 and the metal layer 150 are made of different materials, and the patterned mask 160 is used as an etching mask. Moreover, the opening 162 and the inner pad 122 disposed below have relative positions. For example, a projection of the opening 162 is projected on the inner pad 122. Referring to FIG. 1E, the portion of the metal layer 150 exposed by the opening 162 and a portion of the seed layer 50 are etched to form a patterned metal mask 170. The patterned metal mask 170 has an opening 172 exposing a portion of the dielectric layer 130. It should be noted that in the embodiments of the invention, a plug (the conductive block in the invention) and an outer pad will be formed in the same step to form an integrative unit through the disposition of the patterned metal mask 170 later. The details are illustrated below.

Referring to FIG. 1F, the patterned mask 160 is removed. The portion of the dielectric layer 130 exposed by the opening 172 is removed by a laser process to form a dielectric opening 132. Since an opening 162 of the patterned mask 160 (as shown in FIG. 1E), an opening 172 of the patterned metal mask 170, and the inner pad 122 disposed below have relative positions, the dielectric opening 132 formed through the openings 162, 172 exposes the inner pad 122. In addition, other than the laser etching, the dielectric layer 130 can also be removed by adopting an ion selective etching or a plasma selective etching. Referring to FIG. 1G and FIG. 1H, another seed layer 60 for electroplating is formed on an inner wall of the dielectric opening 132, and a patterned mask 180 is formed on the patterned metal mask 170. The patterned mask 180 and the patterned metal mask 170 are made of different materials. The patterned mask 180 has an opening 182 exposing a portion of the patterned metal mask 170 and a portion of the inner pad 122, so as to form a ladder-shape profile on the cross-section in FIG. 1H.

Referring to FIG. 1I, a conductive structure 140 covering the inner pad 122 is electroplated. The electroplating conductive structure 140 includes a conductive block 142, an outer pad 144, and a metal layer 146. The electroplating conductive structure 140 is made of copper, for instance. The conductive block 142 fills the dielectric opening 132, the outer pad 144 fills the opening 172, and the metal layer 146 fills the opening 182. Consequently, the electroplating conductive structure 140 and the inner pad 122 form a profile of "I"-shape on the cross-section in FIG. 1I. Referring to FIGS. 1J through 1L, the patterned mask 180, the metal layer 146, the patterned metal mask 170, and the seed layer 50 are removed sequentially. The metal layer 146 is removed by brushing, polishing, or CMP, for example. As a consequence, only the conductive block 142 and the outer pad 144 remain in the electroplating conductive structure 140. In other embodiment, the outer pad 144 could also be further removed by brushing, polishing, or CMP if needed (not shown in figure). The inner pad 122, the conductive block 142, and the outer pad 144 form a profile of inverted "T"-shape on the cross-section in FIG. 1L. Especially, referring to FIGS. 1J through 1L, since the electroplating conductive structure 140 and the patterned metal mask 170 are made of different materials, when removing the metal layer 146 of the electroplating conductive structure 140, the patterned metal mask 170 is not removed, so that the patterned metal mask 170 is used as an etching mask or a barrier layer. In one embodiment, a metal passivation layer 190 is further formed on the outer pad 144 to complete the fabrication of a circuit substrate 100 (as shown in FIG. 1M). The passivation layer of the metal passivation layer 190 includes Ni/Au, Ni/Pd/Au, Ni/Sn, Pd, Au, Sn, Ag, Sn/Ag, Sn/AG/Au or alloys thereof, or an organic passivation layer.

Referring to FIG. 1M, fabricated by the fabricating process of the circuit substrate in the present embodiment, the circuit substrate 100 includes a base layer 110, a patterned conductive layer 120, a dielectric layer 130, an outer pad 144, and a conductive block 142. In the present embodiment, a metal passivation layer 190 covering the outer pad 144 is further included. The patterned conductive layer 120 is disposed on the base layer 110 and has an inner pad 122. In one embodiment, a portion of the patterned conductive layer 120, for example, is used the inner conductive line 124, such as a signal line, a grounded line, a power line, and so on. The dielectric layer 130 is disposed on the base layer 110 and covers the patterned conductive layer 120. The outer pad 144 is disposed on the dielectric layer 130. The conductive block 142 penetrates the dielectric layer 130 and is connected between the outer pad 144 and the inner pad 122. The outer pad 144 and the conductive block 142 are formed as an integrative unit. Moreover, an outer diameter D1 of the outer pad 144 is substantially equal to an outer diameter D2 of the conductive block 142.

In details, referring to FIG. 1H and FIG. 1I, in the fabricating process of the circuit substrate in the present embodiment, as the patterned metal mask 170 is formed, the conductive block 142 and the outer pad 144 are formed consecutively in the same electroplating step, such that the outer pad 144 and the conductive block 142 in FIG. 1M are formed as an integrative unit. Moreover, the outer diameter D1 of the outer pad 144 and the outer diameter D2 of the conductive block 142 are substantially the same, so that sufficient space is available on the surface of the dielectric layer 130 for circuit disposition. Conventionally, the misalignment between the outer pad 144 and the conductive block 142 usually occurs as the outer pad 144 and the conductive block 142 are formed in different steps. The simultaneous formation of the outer pad 144 and the conductive block 142 prevents inaccurate alignment between the outer pad 144 and the conductive block 142. Also, the conventional fabrication is more costly.

In another embodiment, after the structure in FIG. 1L is formed, if needed, there could be a brushing, polishing, or CMP to remove the outer pad 144, and then a sandblasting surface treatment is further performed. Here, the sandblasting particles include, for example, $Al_2O_3$. In another embodiment, a pumice treatment is performed. When the dielectric layer 130 is substituted with a solder mask material layer and the outer pad 144 is made of copper, the polished rate of solder mask material is greater than the polished rate of copper. Therefore, semi-circular surfaces (two concave surfaces and one convex surface) as shown in FIG. 1N are formed, where these semi-circular surfaces facilitate in the subsequent bonding of elements (i.e. a chip or another circuit substrate). In the present embodiment, after the surface treatment, a metal passivation layer 190 is formed on the outer pad 144 to complete the fabrication of a circuit substrate 100'.

Referring to FIG. 1F, in the present embodiment, an outer diameter D3 of the inner pad 122 is larger than an inner diameter D4 of the dielectric opening 132. However, the invention is not limited thereto, and another example is further illustrated in FIGS. 2A through 2D.

Figure 2A:
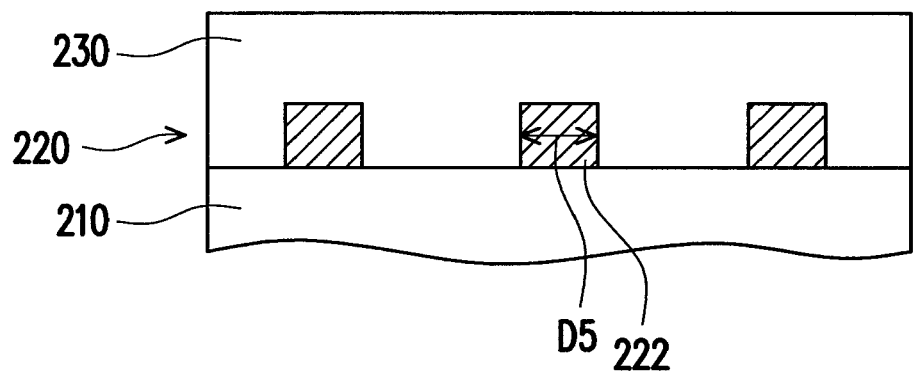
FIGS. 2A through 2D illustrate a cross-sectional flowchart showing a fabricating process of a circuit substrate according to another embodiment of the invention.
Figure 2B:
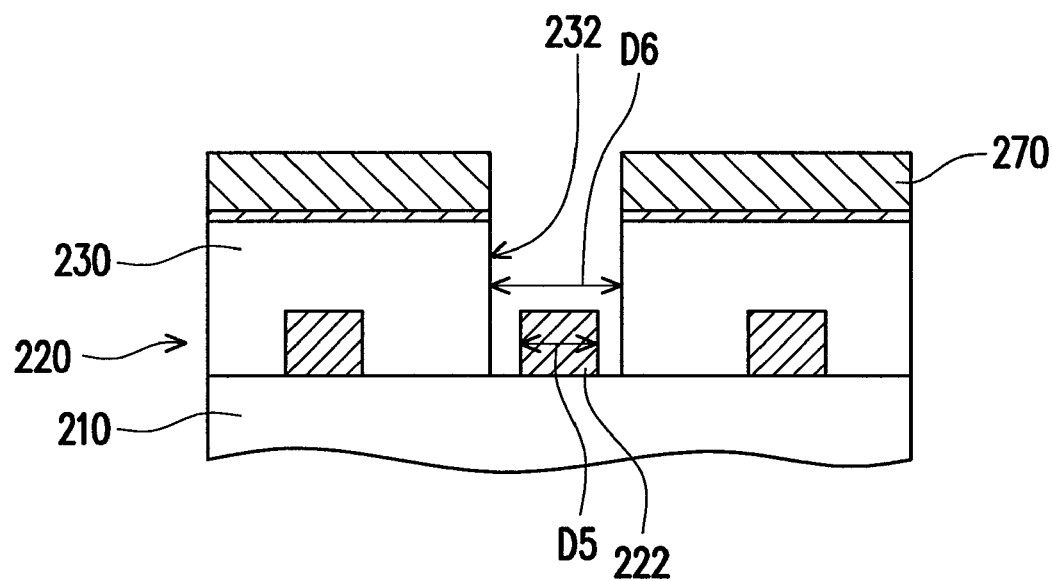

FIGS. 2A through 2D illustrate a cross-sectional flowchart showing a fabricating process of a circuit substrate according to another embodiment of the invention. Referring to FIG. 2A, comparing to the inner pad 122 which has a larger outer diameter D3 as shown in FIG. 1A, an inner pad 222 of a patterned conductive layer 220 provided in the present embodiment has a smaller outer diameter D5. That is, the inner pad 222 is a terminal structure extended from an inner conductive line 224 and is connects therewith as illustrated in FIG. 3. In addition, the outer diameter D5 of the inner pad 222 substantially equals to a line width L2 of the inner conductive line 224. It should be noted that as the inner pad 222 has a smaller outer diameter, a pitch between two adjacent inner pads 222, between the inner pad and the adjacent inner conductive line or between two adjacent inner conductive lines can be reduced. Furthermore, since the large-sized inner pad (having the outer diameter D3) as shown in FIG. 1O is not adopted, when determining the pitch between two adjacent inner pads, the pitch between two adjacent inner conductive lines, or the pitch between the inner pad and the adjacent inner conductive line, only the line width of the inner conductive line has to be considered. Consequently, the integration is increased. Thereafter, a structure illustrated in FIG. 2B is obtained through the fabricating process similar to that shown in FIGS. 1B through 1F. Here, the outer diameter D5 of the inner pad 222 is smaller than an inner diameter D6 of a dielectric opening 232 of a dielectric layer 230. The metal layer 150 fabricated through the process similar to that shown in FIGS. 1B through 1F is also adopted as a mask layer or a barrier in the present embodiment. Next, through the fabricating process similar to that shown in FIGS. 1G through 1M, the structure of FIG. 2B is fabricated into a circuit substrate 200 depicted in FIG. 2C. Herein, the inner pad 222, the conductive block 242, and the outer pad 244 form a profile of "rectangle"-shape on the cross-section in FIG. 2C. Especially, in the process of fabricating the structure illustrated in FIG. 2B to the circuit substrate 200 shown in FIG. 2C, since the conductive structure (not shown in the present embodiment, similar to the electroplating conductive structure 140 in FIG. 1J) and the patterned metal mask 270 are made of different materials, when the metal layer of the conductive structure (not depicted in the present embodiment, similar to the metal layer 146 in FIG. 1J) is removed, a patterned metal mask 270 is not removed to be used as an etching mask or a barrier layer.

Figure 2C:
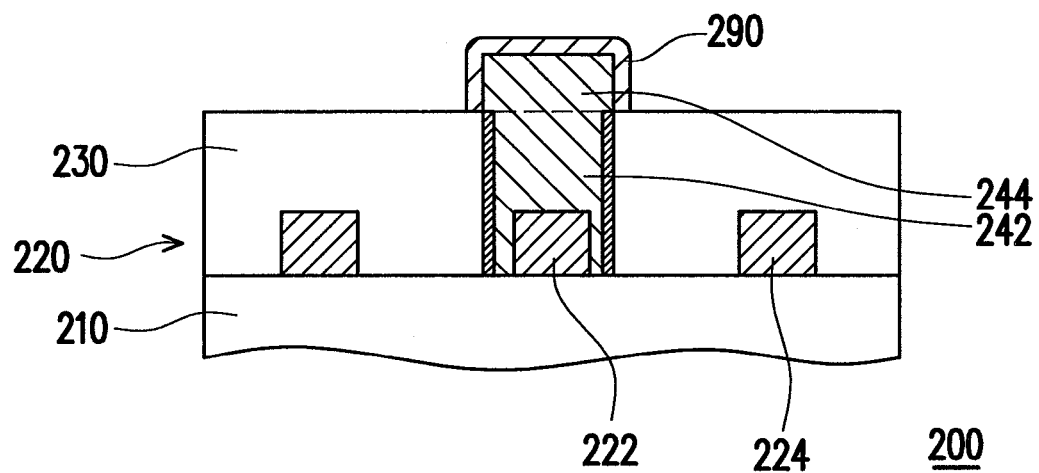
Figure 3:
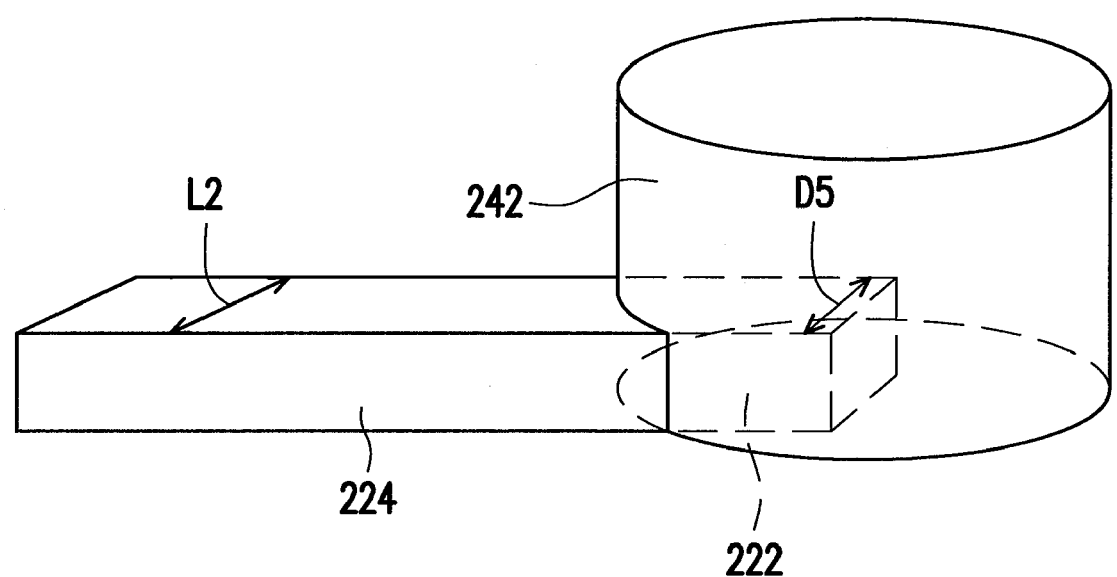
FIG. 3 is a three-dimensional diagram of an inner pad and a conductive block in FIG. 2C.

Referring to FIG. 2C, the circuit substrate 200 includes a base layer 210, a patterned conductive layer 220, a dielectric layer 230, an outer pad 244, and a conductive block 242. In the present embodiment, a metal passivation layer 290 covering the outer pad 244 is further included. The patterned conductive layer 220 is disposed on the base layer 210 and has an inner pad 222. In one embodiment, a portion of the patterned conductive layer 220, for example, is used the inner conductive line 224, such as a signal line, a grounded line, a power line, and so on. The dielectric layer 230 is disposed on the base layer 210 and covers the patterned conductive layer 220. The outer pad 244 is disposed on the dielectric layer 230. The conductive block 242 penetrates the dielectric layer 230 and is connected between the outer pad 244 and the inner pad 222. Through the formation of the patterned metal mask 270 in the fabrication (as illustrated in FIG. 2B), the conductive block 242 and the outer pad 244 are formed in the same electroplating step as an integrative unit. As a consequence, the misalignment between the outer pad 244 and the conductive block 242 that usually results when the outer pad 244 and the conductive block 242 are formed in different steps can be solved. However, if needed, the outer pad 244 could also be removed by brushing, polishing, or CMP before the metal passivation layer 290 formation.

It should be noted that comparing to the inner pad 122 which is only partially covered by the conductive block 142 in FIG. 1M, the inner pad 222 of the present embodiment has a smaller volume and is entirely encapsulated by the conductive block 242. FIG. 3 is a three-dimensional diagram of an inner pad and a conductive block in FIG. 2C. Referring to FIG. 3, in details, the patterned conductive layer 220 (notated in FIG. 2C) has an inner conductive line 224, and the terminal of the inner conductive line 224 constitutes the inner pad 222 encapsulated by the conductive block 242. In particular, the inner pad 222 of the patterned conductive layer 220 provided in the present embodiment has a smaller outer diameter. Thus, a pitch between two adjacent inner pads 222 or between the inner pad 222 and the adjacent inner conductive line 224 can be reduced, thereby enhancing the integration of layout.

Figure 2D:
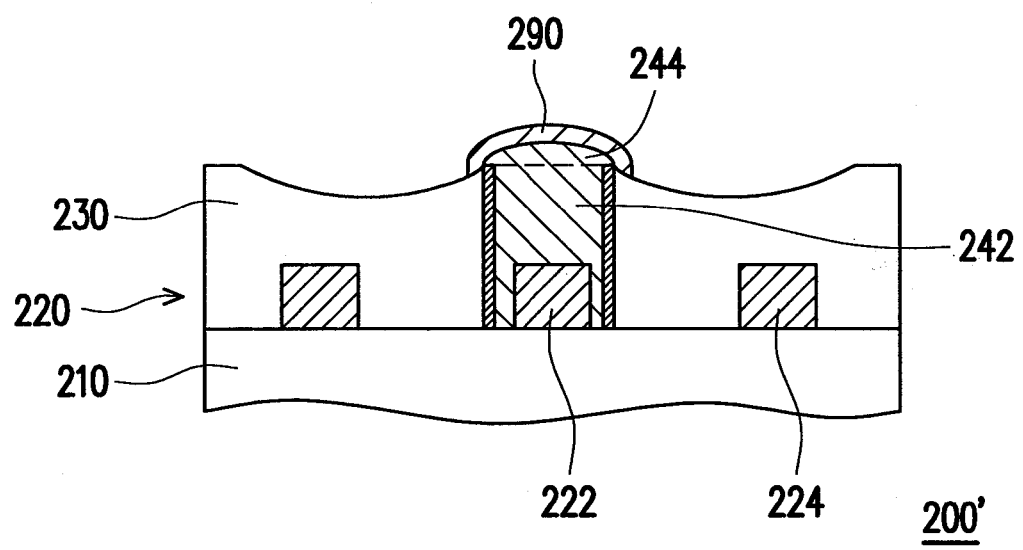

In another embodiment, the structure illustrated in FIG. 2B is fabricated into a circuit substrate 200' shown in FIG. 2D through the fabricating process as that depicted in FIGS. 1G through 1L and the surface sandblasting (or ceramics blasting) treatment depicted in FIG. 1N.

The outer diameter D1 of the outer pad 144 in FIG. 1M is substantially equal to the outer diameter D2 of the conductive block 142. However, the invention is not limited thereto. FIGS. 1F, 4A through 4C provides further illustrations in the following.

Figure 4A:
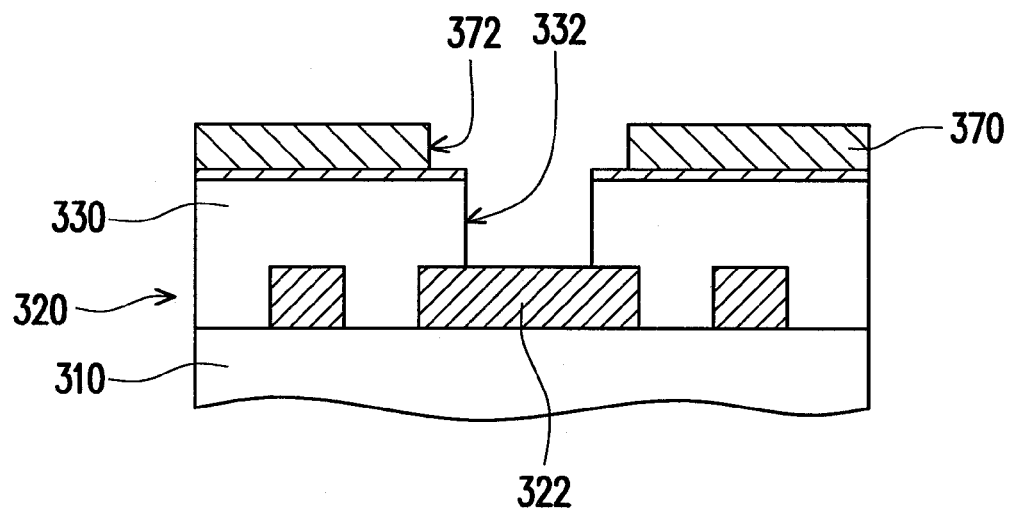
FIGS. 4A through 4C illustrate a cross-sectional flowchart showing a fabricating process of a circuit substrate according to another embodiment of the invention.
Figure 4B:
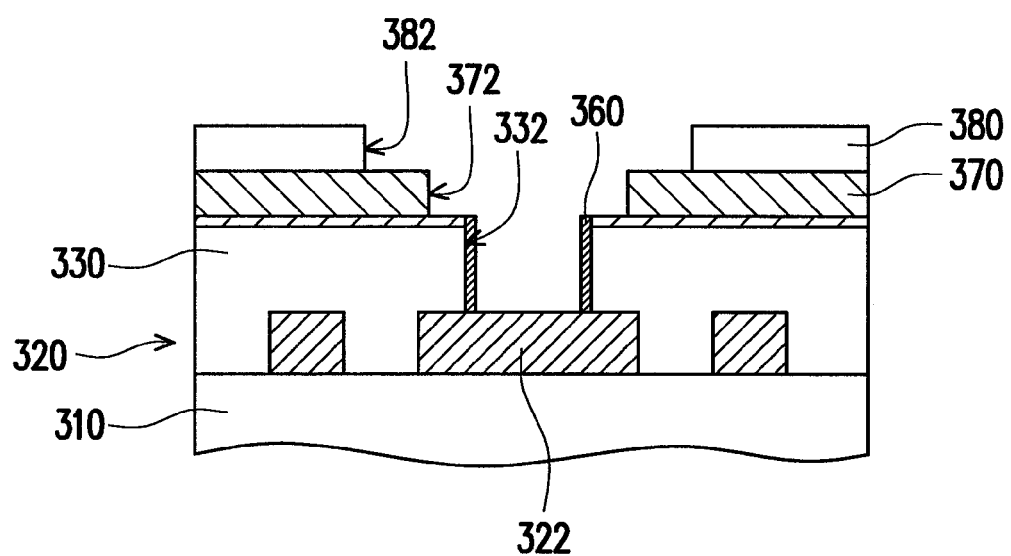
Figure 4C:
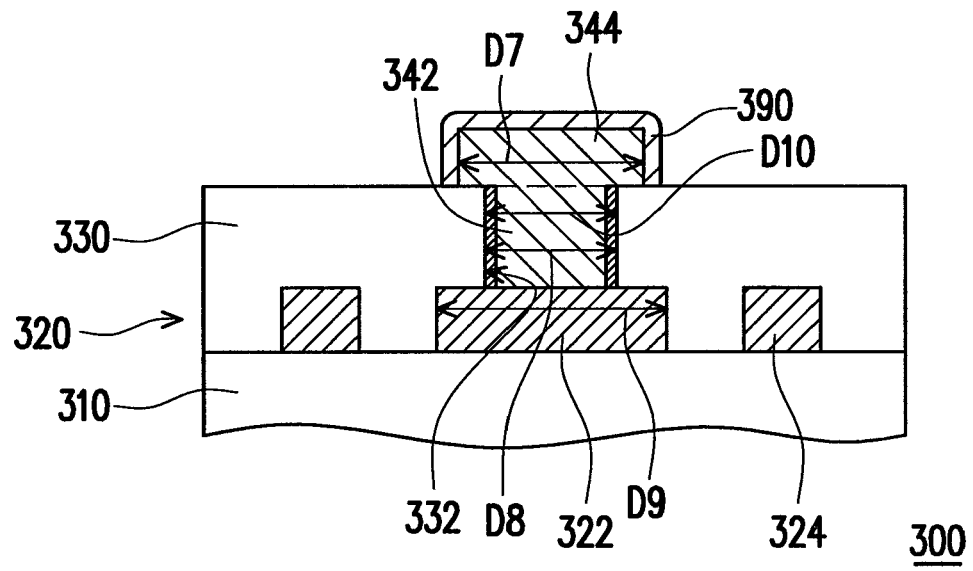

FIGS. 4A through 4C illustrate a cross-sectional flowchart showing a fabricating process of a circuit substrate according to another embodiment of the invention. After the fabricating process shown in FIGS. 1A through 1F has been performed to obtain the structure illustrated in FIG. 1F, the patterned metal mask 170 is selectively etched to expand an opening 372 to form a structure depicted in FIG. 4A. Here, the opening 372 of a patterned metal mask 370 exposes a dielectric opening 332 and a portion of a dielectric layer 330 surrounding the dielectric opening 332. The metal layer 150 shown in the fabricating process in FIGS. 1B through 1F is adopted as a mask layer or a barrier layer in the present embodiment. Referring to FIG. 4B, with a fabricating process similar to that illustrated in FIG. 1G, a seed layer 360 for electroplating is formed on an inner wall of the dielectric opening 332, and a patterned mask 380 is formed on the patterned metal mask 370. The patterned mask 380 has an opening 382 exposing a portion of the patterned metal mask 370 and a portion of the inner pad 322, so as to form a ladder-shape profile on the cross-section in FIG. 4B. Next, through the fabricating process similar to that shown in FIGS. 1I through 1M, the structure of FIG. 4B is fabricated into a circuit substrate 300 depicted in FIG. 4C after the patterned metal mask 370 is removed. Herein, the inner pad 322, a conductive block 342, and an outer pad 344 form a profile of "rectangle"-shape on the cross-section in FIG. 4C. Especially, in the process of fabricating the structure illustrated in FIG. 4B to the circuit substrate 300 shown in FIG. 4C, since the conductive structure (not shown in the present embodiment, similar to the electroplating conductive structure 140 in FIG. 1J) and the patterned metal mask 370 are made of different materials, when the metal layer of the conductive structure (not depicted in the present embodiment, similar to the metal layer 146 in FIG. 1J) is removed, a patterned metal mask 370 is not removed but is used as an etching mask or a barrier layer.

Referring to FIG. 4C, the circuit substrate 300 includes a base layer 310, a patterned conductive layer 320, a dielectric layer 330, an outer pad 344, and a conductive block 342. In the present embodiment, a metal passivation layer 390 covering the outer pad 344 is further included. The patterned conductive layer 320 is disposed on the base layer 310 and has an inner pad 322. In one embodiment, a portion of the patterned conductive layer 320, for example, is used the inner conductive line 324, such as a signal line, a grounded line, a power line, and so on. The dielectric layer 330 is disposed on the base layer 310 and covers the patterned conductive layer 320. The outer pad 344 is disposed on the dielectric layer 330. The conductive block 342 penetrates the dielectric layer 330 and is connected between the outer pad 344 and the inner pad 322. In particular, through the formation of the patterned metal mask 370 (noted in FIG. 4B) in the fabrication, the conductive block 342 and the outer pad 344 are formed in the same electroplating step as an integrative unit. As a consequence, the misalignment between the conductive block 342 and the outer pad 344 that usually results when the conductive block 342 and the outer pad 344 are formed in different steps can be solved. It should be noted that comparing to the inner pad 144 in FIG. 1M, where the outer diameter D1 of the outer pad 144 substantially equals to the outer diameter D2 of the conductive block 142, an outer diameter D7 of the outer pad 344 is larger than an outer diameter D8 of the conductive block 342 in the present embodiment.

Figure 5:
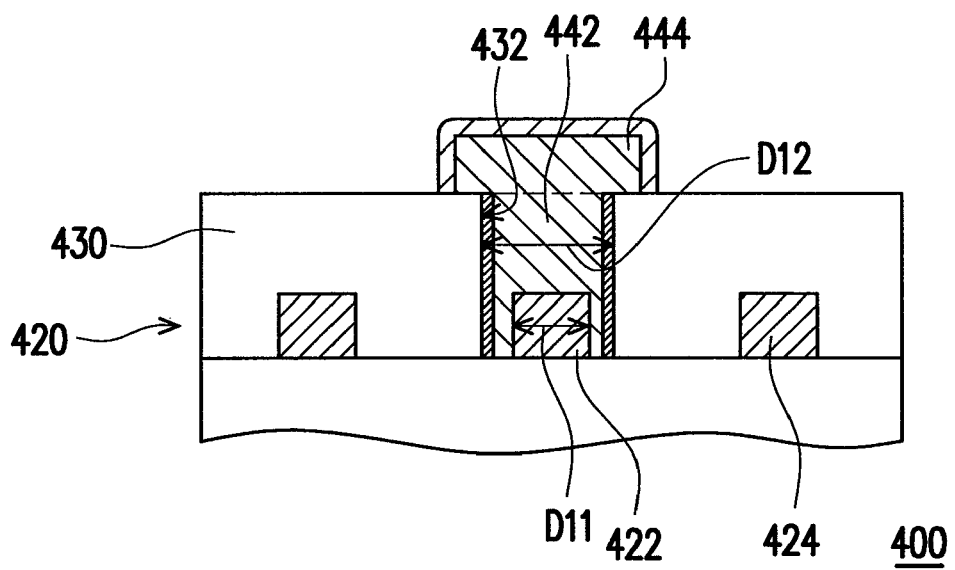
FIG. 5 is a cross-sectional view of a circuit substrate according to an embodiment of the invention.

FIG. 5 is a cross-sectional view of a circuit substrate according to an embodiment of the present invention. Referring to FIG. 5, compared to FIG. 4C, where an outer diameter D9 of the inner pad 322 is larger than an outer diameter D10 of the dielectric opening 332 of the dielectric layer 330, an outer diameter D11 of an inner pad 422 is smaller than an inner diameter D12 of a dielectric opening 432 of a dielectric layer 430 in the present embodiment. The inner pad 422, the conductive block 442, and the outer pad 444 form a profile of "T"-shape on the cross-section. In addition, similar to the structure shown in FIG. 3, the inner pad 422 in FIG. 5 is constituted by the terminal of the inner conductive line of the patterned conductive layer 420, for instance. In particular, the inner pad 422 of the patterned conductive layer 420 provided in the present embodiment has a smaller outer diameter (substantially equal to the line width of the inner conductive line). Therefore, a pitch between two adjacent inner pads 422 or between the inner pad 422 and the adjacent inner conductive line 424 can be reduced, thereby enhancing the integration of layout.

Figure 6A:
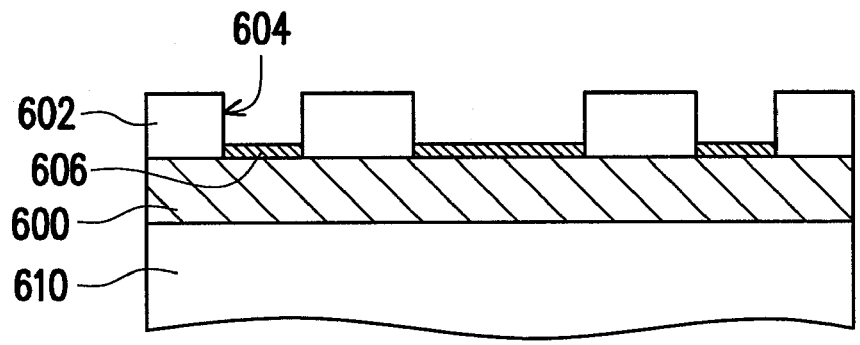
FIGS. 6A through 6E illustrate a cross-sectional flowchart showing a fabricating process of a circuit substrate according to another embodiment of the invention.
Figure 6B:
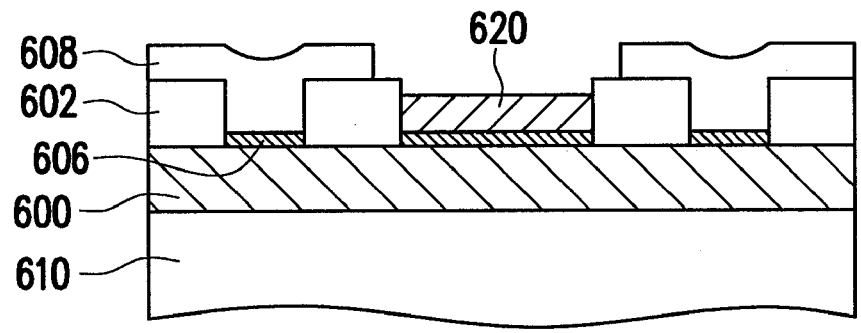
Figure 6C:
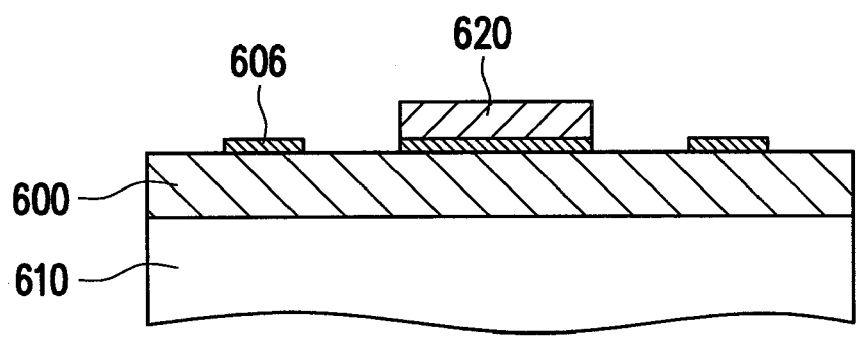
Figure 6D:
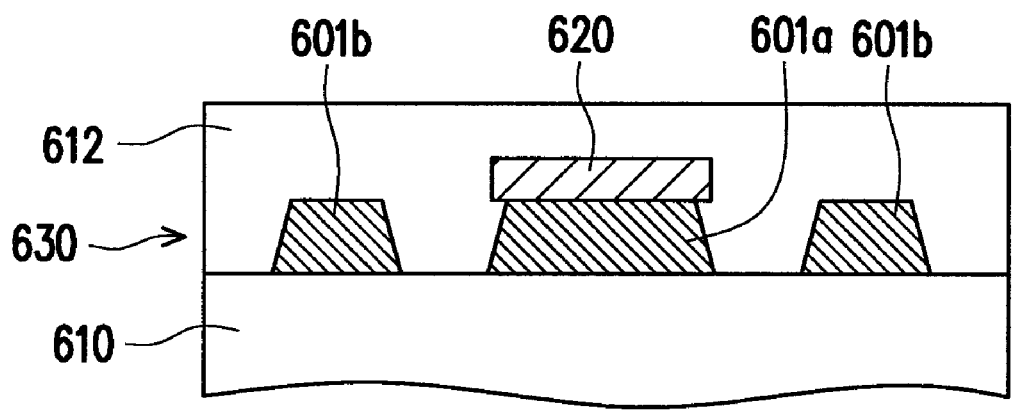
Figure 6E:
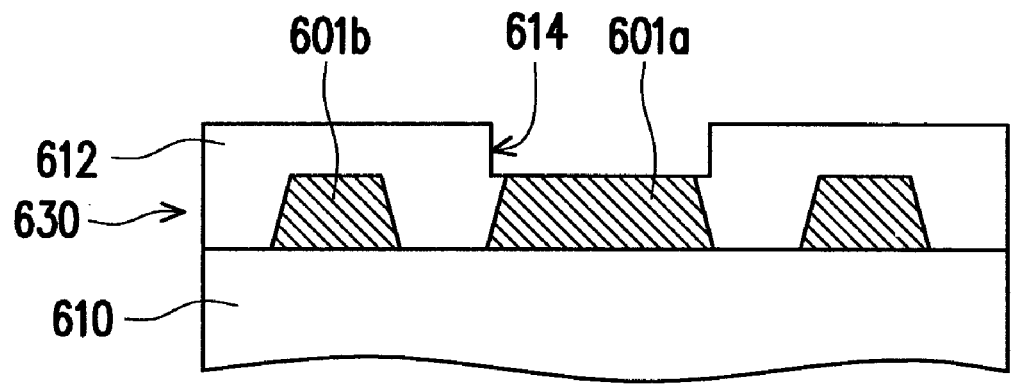

In another embodiment, the circuit substrate of the invention is also fabricated with the following process. FIGS. 6A through 6E illustrate a cross-sectional flowchart showing a fabricating process of a circuit substrate according to another embodiment of the invention. Referring to FIG. 6A, a base layer 610 is provided. Herein, the base layer 610, for example, is a circuit layer of a chip, a circuit layer of a chip carrier, or a circuit layer of a printed circuit board. Thereafter, a conductive layer 600 is formed on the base layer 610, and a patterned mask 602 having a plurality of openings 604 is formed on the conductive layer 600. Next, a seed layer 606 for electroplating is formed on the conductive layer 600 exposed by the openings 604. Thereafter, referring to FIG. 6B, another patterned mask 608 is formed to cover a portion of the seed layer 606 and electroplate a metal layer 620 on the seed layer 606 exposed by the patterned mask 602. Referring to FIG. 6C, the patterned mask 608 and the pattern mask 602 are removed to expose the metal layer 620 and the seed layer 606. Additionally, the metal layer 620 and the seed layer 606 are adopted as a mask to etch the conductive layer 600, so as to form a patterned conductive layer 630. The seed layer 606 could be the same metal with metal layer 620 to simplify process. Consequently, a pad 601a and a plurality of conductive lines 601b are formed. Thereafter, a dielectric layer 612 is further formed to result in the structure shown in FIG. 6D. Referring to FIG. 6E, a portion of the dielectric layer 612 is removed through brushing, polishing, CMP, ion etching, or plasma etching, so that the metal layer 620 is exposed. The metal layer 620 is then removed to expose the pad 601a, thereby forming an opening 614. In the present embodiment, the opening 614 is formed by directly removing the metal layer 620, so as to prevent the misalignment between the etched opening 614 and the pad 601a disposed below.

In summary, the outer pad and the conductive block of the invention are simultaneously formed as an integrally formed conductive structure through the same electroplating step. Therefore, the outer pad and the conductive block are formed by the same electroplating step, such that the misalignment of the outer pad and the conductive block is avoided. Further, the outer diameter of the outer pad and the outer diameter of the conductive block are designed to be equal, such that sufficient space is available on the dielectric layer surface for circuit disposition. The inner pad is constituted by the terminal of the inner conductive line of the patterned conductive layer, so that the outer diameter of the inner pad is smaller than the outer diameter of the conductive block, thereby reducing the pitch between two adjacent inner pads or the pitch between the inner pad and the adjacent inner conductive line. The integration of the layout is consequently enhanced.

In addition, in the invention, after the outer pad is formed, a sandblasting surface treatment is further performed to enhance the subsequent bonding between the outer pad and the devices.

Although the invention has been described with reference to the above embodiments, it will be apparent to one of ordinary skill in the art that modifications to the described embodiment may be made without departing from the spirit of the invention. Accordingly, the scope of the invention will be defined by the attached claims not by the above detailed descriptions.

What is claimed is:

1. A fabricating process of a circuit substrate, comprising:
   providing a base layer, a patterned conductive layer, and a dielectric layer, wherein the patterned conductive layer is disposed on the base layer and has an inner pad, and the dielectric layer is disposed on the base layer and covers the patterned conductive layer;
   forming a patterned metal mask on the dielectric layer, wherein the patterned metal mask has a first opening exposing a portion of the dielectric layer;
   removing the portion of the dielectric layer exposed by the first opening to form a dielectric opening, wherein the dielectric opening exposes the inner pad;
   forming a first patterned mask on the patterned metal mask, wherein the first patterned mask has a second opening exposing the inner pad;
   forming a conductive structure covering the inner pad, wherein the conductive structure comprises a conductive block, an outer pad, and a first metal layer, the conductive block fills the dielectric opening, the outer pad fills the first opening, and the first metal layer fills the second opening; and
   removing the first patterned mask, the first metal layer, and the patterned metal mask.

2. The fabricating process of the circuit substrate as claimed in claim 1, wherein a method of forming the patterned metal mask comprises:
   forming a seed layer for electroplating on the dielectric layer;
   electroplating a second metal layer on the seed layer;
   forming a second patterned mask on the second metal layer, wherein the second patterned mask has a third opening exposing a portion of the second metal layer;
   etching the portion of the second metal layer exposed by the third opening and a portion of the seed layer to form the patterned metal mask; and
   removing the second patterned mask.

3. The fabricating process of the circuit substrate as claimed in claim 1, wherein a method of removing the portion of the dielectric layer exposed by the first opening comprises a laser process, an ion selective etching, or a plasma selective etching.

4. The fabricating process of the circuit substrate as claimed in claim 1, wherein a method of forming the conductive structure comprises:
   forming a seed layer for electroplating on an inner wall of the dielectric opening; and
   electroplating the conductive structure covering the inner pad.

5. The fabricating process of the circuit substrate as claimed in claim 1, wherein a method of removing the first metal layer comprises a brushing process, a polishing process, or a chemical mechanical polishing process.

6. The fabricating process of the circuit substrate as claimed in claim 1, wherein an outer diameter of the inner pad is larger than an inner diameter of the dielectric opening.

7. The fabricating process of the circuit substrate as claimed in claim 1, wherein an outer diameter of the inner pad is smaller than an inner diameter of the dielectric opening.

8. The fabricating process of the circuit substrate as claimed in claim 1, wherein an outer diameter of the outer pad is larger than an outer diameter of the conductive block.

9. The fabricating process of the circuit substrate as claimed in claim 1, wherein an outer diameter of the outer pad is substantially equal to an outer diameter of the conductive block.

10. The fabricating process of the circuit substrate as claimed in claim 1, further comprising:

before forming the first patterned mask, etching the patterned metal mask so that the first opening exposes the dielectric opening and a portion of the dielectric layer surrounding the dielectric opening.

11. The fabricating process of the circuit substrate as claimed in claim 1, further comprising:

after removing the patterned metal mask, performing a sandblasting treatment to the outer pad and a portion of the dielectric layer surrounding the outer pad, such that the outer pad protrudes over the dielectric layer in a curve and the portion of the dielectric layer surrounding the outer pad concaves relative to other portions of the dielectric layer.

* * * * *